(12) United States Patent
Palmer

(10) Patent No.: US 10,733,104 B2
(45) Date of Patent: Aug. 4, 2020

(54) FAST NON-VOLATILE STORAGE DEVICE RECOVERY TECHNIQUES

(71) Applicant: Micron Technology, Inc., Boise, ID (US)

(72) Inventor: David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 16/054,096

(22) Filed: Aug. 3, 2018

(65) Prior Publication Data

US 2020/0042452 A1 Feb. 6, 2020

(51) Int. Cl.
| | |
|---|---|
| *G06F 12/08* | (2016.01) |
| *G06F 12/0866* | (2016.01) |
| *G06F 12/0804* | (2016.01) |
| *G06F 13/12* | (2006.01) |
| *G06F 9/445* | (2018.01) |
| *G06F 1/24* | (2006.01) |
| *G06F 13/38* | (2006.01) |

(52) U.S. Cl.
CPC ............ *G06F 12/0866* (2013.01); *G06F 1/24* (2013.01); *G06F 9/445* (2013.01); *G06F 12/0804* (2013.01); *G06F 13/124* (2013.01); *G06F 13/385* (2013.01); *G06F 2212/222* (2013.01)

(58) Field of Classification Search
CPC ......... G11C 11/34; G11C 16/04; G11C 16/10; G06F 3/06; G06F 3/0616; G06F 3/0664; G06F 3/0658; G06F 3/0679; G06F 12/08; G06F 12/0866; G06F 1/24; G06F 9/445; G06F 12/0804; G06F 13/124; G06F 13/385; G06F 2212/222

USPC .......................................................... 711/111
See application file for complete search history.

(56) References Cited

U.S. PATENT DOCUMENTS

| | | | | |
|---|---|---|---|---|
| 5,787,484 A | * | 7/1998 | Norman ................ | G06F 3/0616 711/137 |
| 5,956,289 A | * | 9/1999 | Norman ................... | G11C 7/22 365/164 |
| 6,601,211 B1 | * | 7/2003 | Norman ............... | G06F 11/1068 714/773 |
| 6,804,763 B1 | * | 10/2004 | Stockdale ........... | G07F 17/3241 463/24 |
| 2003/0163594 A1 | * | 8/2003 | Aasheim ............... | G06F 3/0619 719/310 |

(Continued)

FOREIGN PATENT DOCUMENTS

| | | |
|---|---|---|
| KR | 101573591 | 12/2015 |
| KR | 20160051328 | 5/2016 |

(Continued)

OTHER PUBLICATIONS

"International Application Serial No. PCT US2019 044926, International Search Report dated Nov. 20, 2019", 4 pgs.

(Continued)

*Primary Examiner* — Mano Padmanabhan
*Assistant Examiner* — Jean C Edouard
(74) *Attorney, Agent, or Firm* — Schwegman Lundberg & Woessner, P.A.

(57) ABSTRACT

Techniques are disclosed herein for providing accelerated recovery techniques of a memory device. Such techniques can allow for recovery of the memory device, such as, but not limited to, a flash memory device, following an unexpected reset event.

19 Claims, 4 Drawing Sheets

(56) References Cited

U.S. PATENT DOCUMENTS

| | | | |
|---|---|---|---|
| 2007/0279988 A1* | 12/2007 | Nguyen | G11C 16/0483 365/185.18 |
| 2008/0215808 A1* | 9/2008 | Ashmore | G06F 1/3203 711/113 |
| 2012/0173835 A1* | 7/2012 | Lee | G06F 9/30043 711/166 |
| 2013/0042095 A1 | 2/2013 | Jung | |
| 2013/0124888 A1* | 5/2013 | Tanaka | G11C 16/06 713/320 |
| 2015/0117107 A1* | 4/2015 | Sun | G11C 16/10 365/185.12 |
| 2018/0074718 A1 | 3/2018 | Lee | |

FOREIGN PATENT DOCUMENTS

| | | |
|---|---|---|
| KR | 20160137501 | 11/2016 |
| WO | 2020028818 | 2/2020 |

OTHER PUBLICATIONS

"International Application U.S. Serial No. PCT US2019 044926, Written Opinion dated Nov. 20, 2019", 5 pgs.

\* cited by examiner

FAST NON-VOLATILE STORAGE DEVICE RECOVERY TECHNIQUES

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
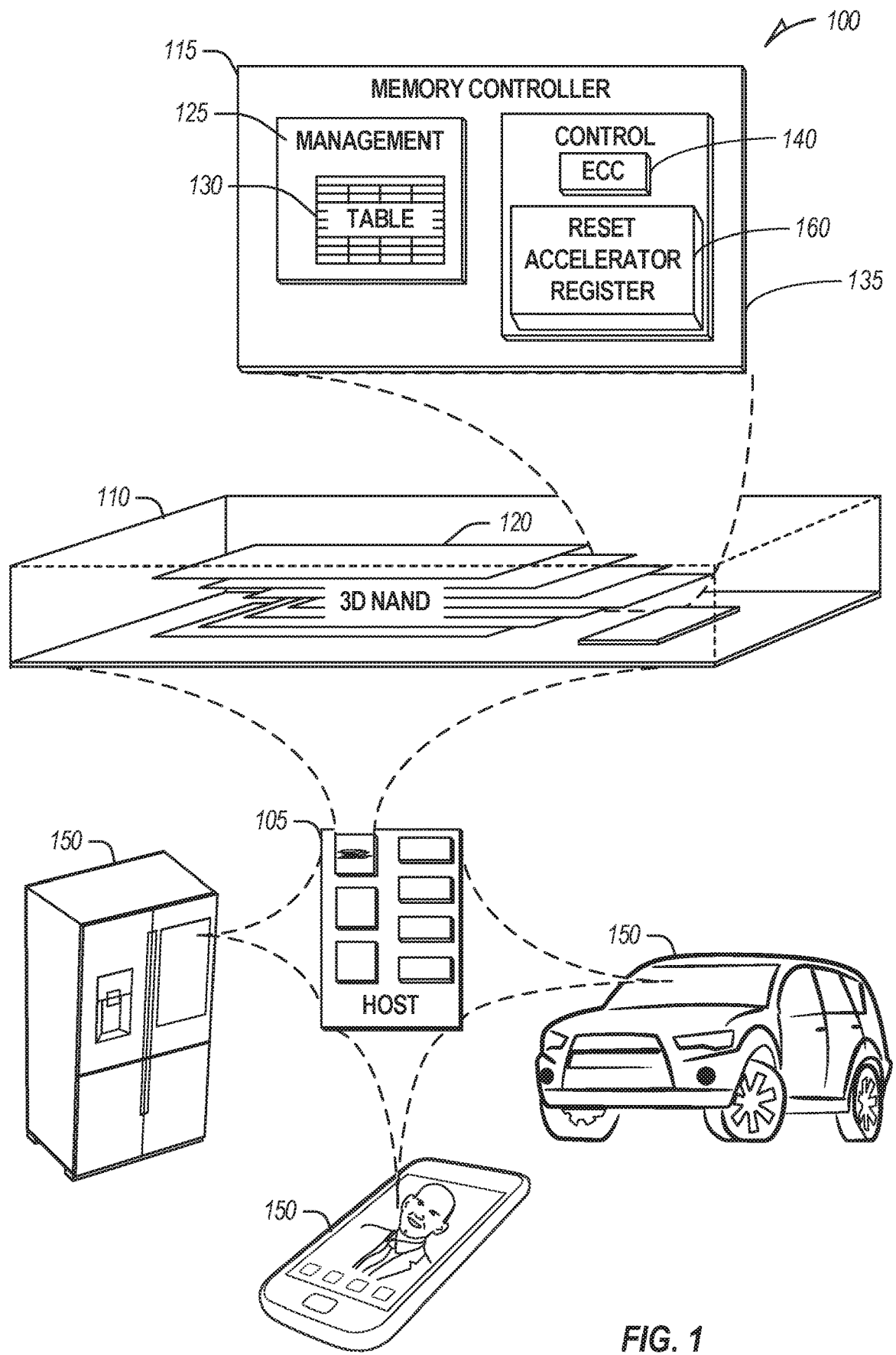
FIG. 1 illustrates an example of an environment including a host and a memory device.

Flash memory devices including NAND-based storage can be cumbersome to recover after an unexpected loss of power or some other event that can interrupt on-going memory operations and cause a reset. Such recovery processes can be slow because the memory controller must first determine what the memory device was doing just prior to the unexpected event. Once the interrupted memory operations are determined, the memory controller can then determine what recovery operations are appropriate and in what order.

Non-volatile storage devices can be exposed to unexpected events for many reasons, including but not limited to, power rail voltage droop, watch dog time out, instruction SRAM bit flip. Recovery operations can be quite slow because it can take significant time to piece together what the memory device was doing before the reset, and what type of memory operations can clean-up uncompleted operations and recover the memory device to a known state. Present recovery processes for non-volatile memory devices incorporate complex algorithms in the memory device to determine, for example, on power-up, if recovery operations are necessary. If a reset occurred during memory operations, pages may be partially programmed and readable, partially programmed and unreadable, apparently empty but partially programmed, or combinations thereof. The complex recovery algorithms determine each open block of memory, investigate each open block for potential memory operation failure, and apply remediation to recover the memory device to a known operational state.

The present inventor has recognized techniques for quickly determining what major memory operations were in-progress at the unexpected event, thus, eliminating the need for complex algorithms to examine the memory and attempt to deduce the operations that had been initiated but not completed at the time of the unexpected reset. In certain examples, the memory system includes a reset accelerator register. The reset accelerator register is a non-volatile register the memory system controller can use to keep a scratchpad of in-process memory operations. In certain examples, the memory controller can set an indication in the reset accelerator register when a memory operation is initiated. In some examples, the indication can be a dedicated flag or bit associated with a particular memory operation that upon reset of the memory device can help focus a search for what operations were left uncompleted. Unlike generic scratchpads, the reset accelerator register is a non-volatile register that does not get reset upon start-up of the memory device after a reset event of the memory device, and, in certain examples, is exclusively for tracking status of memory operations. In some examples, the indication can include additional information about the operation including, but not limited to what locations of the memory system the operation accesses. In certain examples, as the memory operation progresses, the memory controller or one or more die controllers can update the indication such that upon reset the memory controller can determine what sub-operations of the particular memory operation were not yet completed or were in-progress.

FIG. 1 illustrates an example of an environment 100 including a host 105 and a memory device 110 configured to communicate over a communication interface. The host 105 or the memory device 110 may be included in a variety of products 150, such as IoT devices (e.g., a refrigerator or other appliance, sensor, motor or actuator, mobile communication device, automobile, mobile phone, drone, etc.) to support processing, communications, or control of the product 150.

The memory device 110 includes a memory controller 115 and a memory array 120 including, for example, one or more individual memory die (e.g., a stack of three-dimensional (3D) NAND die). In 3D architecture semiconductor memory technology, vertical structures are stacked in multiple tiers, and coupled to form physical pages, to increase the storage density of a memory device (e.g., a storage device) in a given footprint (i.e. form factor). In an example, the memory device 110 can be a discrete memory or storage device component of the host 105. In other examples, the memory device 110 can be a portion of an integrated circuit (e.g., system on a chip (SOC), die, etc.), stacked or otherwise included with one or more other components of the host 105.

One or more communication interfaces can be used to transfer data between the memory device 110 and one or more other components of the host 105, such as a Serial Advanced Technology Attachment (SATA) interface, a Peripheral Component Interconnect Express (PCIe) interface, a Universal Serial Bus (USB) interface, a UFS interface, an eMMC™ interface, or one or more other connectors or interfaces. The host 105 can include a host system, an electronic device, a processor, a memory card reader, or one or more other electronic devices external to the memory device 110. In some examples, the host 105 may be a machine having some portion, or all, of the components discussed in reference to the machine 400 of FIG. 4. Data may be transferred between the memory device 110 and other components over an input/output (I/O) bus that may include one or more latches for temporarily storing the data as it is being transferred (e.g., before being read or written from/to a memory array).

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, control circuitries, or components configured to control access across the memory array 120 and to provide a translation layer between the host 105 and the memory device 110. The memory controller 115 can include one or more I/O circuits (and corresponding latches), lines, or interfaces to transfer data to or from the memory array 120. The memory controller 115 can include a memory manager 125 and an array controller 135.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. ECC component 140, for example, may detect or compute a bit-error-rate (BER) associated with performing a number of memory operations. The BER may correspond to bit errors occurring in latches of an I/O bus, internal errors of controller 115, errors occurring in one or more of the NAND arrays, or any one or more of the multi-level cell(s) (MLC) of the memory device 110. The memory controller 115 can be configured to actively detect and recover from error occurrences (e.g., bit errors, operation errors, crash conditions, stalls, hang ups, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors. Array controller 135 may transmit detected BER information to memory manager 125 for storage and tracking. The memory controller 115 may include a command queue (not shown) that tracks memory commands received from a host. Commands in the queue may be executed by controller 115 in a first-in first-out (FIFO) manner, stack manner, out of sequence, according to priority, or in any other suitable order.

The described memory device 110 includes a reset accelerator register 160 in association with the memory array 120. In some implementations, controller 115 of memory device 110 may include control circuitry configured to implement the functions of the reset accelerator register 160 as set forth below. In other implementations, the reset accelerator register 160 may include independent control circuitry for implementing the described functionality. In yet other implementations, control circuitry may be divided between the reset accelerator register 160 and controller 115 to implement the described functions of the reset accelerator register 160. In the depicted example, the array controller 135 forms a portion of the memory controller 115, and the reset accelerator register 160 forms a portion of the array controller. In other implementations, reset accelerator register 160 may be external, and/or outside of array controller 135. For example, the reset accelerator register 160 (or any individual components thereof), may be an independent component coupled to one or more components in environment 100. However physically located, the structures providing the additional functionality of the reset accelerator register 160, functions reduce recovery time between an unexpected interruption of the memory device 110 and the subsequent operation of the memory device 110 without losing data.

The memory manager 125 can include, among other things, circuitry or firmware, such as a number of components or integrated circuits associated with various memory management functions. For purposes of the present description, example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection (e.g., BER monitoring) or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more components of the memory device 110 (e.g., various information associated with a memory array or one or more memory cells coupled to the memory controller 115). For example, the management tables 130 can include information regarding block age, block erase count, error history, error parameter information, host reset timeout value, memory operation command latencies, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts (e.g., an error parameter) is above a threshold (e.g., an allowable error threshold), the bit error can be referred to as an uncorrectable bit error. The management tables 130 can maintain a count of correctable or uncorrectable bit errors, among other things.

The memory array 120 can include multiple memory cells arranged in, for example, a number of devices, planes, sub-blocks, blocks, or pages. As one example, a 48 GB TLC NAND memory device can include 18,592 bytes of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the memory device 110 in pages and erased in blocks. However, one or more memory operations (e.g., read, write, erase, etc.) can be performed on larger or smaller groups of memory cells, as desired. The data transfer size of a memory device 110 is typically referred to as a page, whereas the data transfer size of a host is typically referred to as a sector.

Different types of memory cells or memory arrays 120 can provide for different page sizes or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a MLC NAND flash device may have a higher bit error rate than a corresponding single-level cell (SLC) NAND flash device. As such, the MLC device may require more metadata bytes for error data than the corresponding SLC device.

Figure 2:
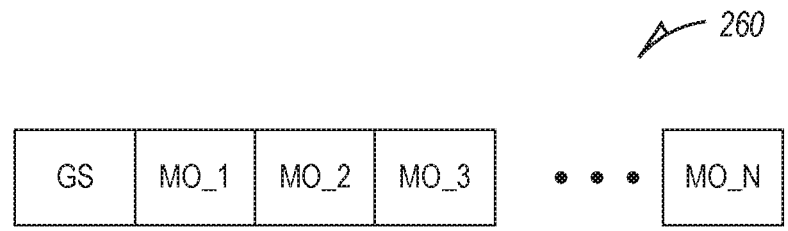
FIG. 2 illustrates generally an example reset accelerator register.

FIG. 2 illustrates generally an example reset accelerator register 260. The reset accelerator register 260 can include a multiple-cell register, such as a multiple-bit register as shown, multiple-word register, etc. In certain examples, each cell can provide information about an in-process activity or operation of a memory device at or just prior to an unexpected reset event. For example, a first cell (e.g., bit) (MO_1) of the reset accelerator register 260, if set, can indicate that a first memory operation was in-process at or near the time of an unexpected reset event, and, if not set, the first memory operation was not in-process at or near the time of the unexpected reset event. In certain examples, the memory controller such as the memory controller of FIG. 1, can set each cell (MO_1, MO_2, . . . , MO_N) as the appropriate memory operation is initiated and can reset the cell when the memory operation concludes. Memory operations can include, but are not limited to, garbage collection of a block of user data, garbage collection of a block of internal data, refresh of user data, refresh of internal data, read error handling, write error handling, wear leveling, block retirement, host read, host write, power-on recovery, etc.

In certain examples, the reset accelerator register can include a general status (GS) element that when set indicates at least one memory operation was in-process at the time of the unexpected reset event, and when not set, indicates that the memory device was idle and not performing any of the identified operations at the time of the unexpected reset event. Upon resetting and finding that no memory operations were in-process at the time of the unexpected reset event, the memory controller can skip the process of probing each open memory block for evidence that a memory operation was in-process and additional time to evaluate the evidence for what particular operation was in-process. Thus, the implementation of a reset accelerator register 260 can represent significant time saving in getting the system back up and running after an unexpected reset event. If the general status (GS) element is set, satisfies an "uncompleted" threshold, or does not satisfy a "completed" or "idle" threshold, the memory controller can begin to evaluate the status of the specific memory operations of the other cells or elements of the reset accelerator register 260 to determine what memory operations may need to be completed, recovered, or remediated in order to allow the memory device to service host memory requests.

Figure 3:
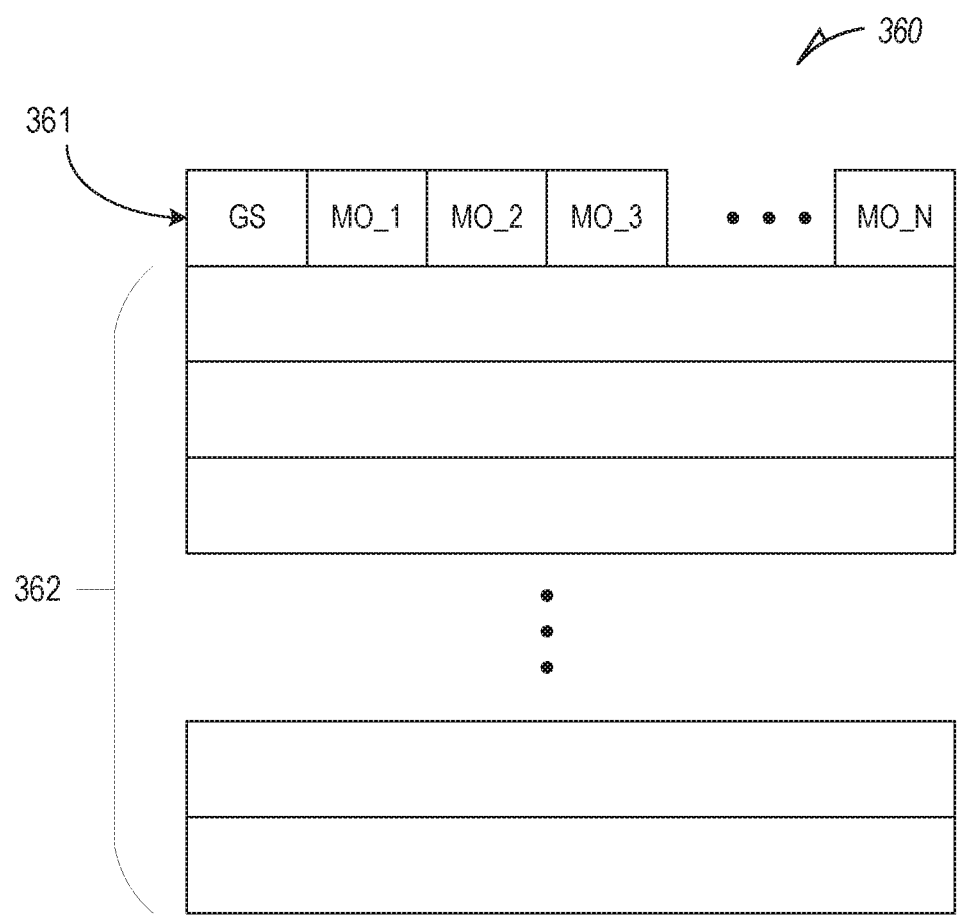
FIG. 3 illustrates generally another example of a reset accelerator register according to the present subject matter.

FIG. 3 illustrates generally another example of a reset accelerator register 360 according to the present subject matter. The reset accelerator register 360 can include a first record 361 similar to the register of FIG. 2. The first record can provide a general overview of memory activity at or near the time of the unexpected reset event. In certain examples, an element of the first record 361 can provide a general status indication that when set indicates at least one of memory operation was in-process at the time of the unexpected reset event, and when not set, indicates that the memory device was idle and not performing any of the identified memory operations at the time of the unexpected reset event. Other elements of the first record 361 can provide an indication of different types of memory operation (MO_1, MO_2, . . . , MO_N) that were, or were not, in-process at or near the time of the unexpected reset event. Other records of the reset accelerator register 360 can be associated with or mapped to the elements of the first record 361 of the reset accelerator register 360 and can include detailed information about the memory operation indicated by the elements (MO_1, MO_2, . . . , MO_N) the record is mapped to, or associated with. Such detailed information can include, but is not limited to, one or more physical addresses associated with the memory operation, indications of sub-process activity associated with the memory operation, a host LBA associated with the memory operation or combinations thereof.

Upon start-up from a reset event, or even a non-reset event, the memory controller can evaluate the first record 361 of the reset accelerator register to discover each memory operation that may have been left uncompleted. The memory controller can further evaluate the other records 362 of the reset accelerator register, for example, via links mapping the other records 362 to elements of the first record 361, to gather and analyze more detailed information about the state of the uncompleted operations. Such detailed information can allow the memory controller to avoid analyzing every open NAND memory block to determine if a memory operation was uncompleted when operating on the block, whether recovery operations are appropriate, and which recovery operations to undertake and schedule. In certain examples, the reset accelerator register 360 can provide the memory controller the information needed to select and initiate recovery operations without accessing each open memory block. In certain examples, especially with mobile computing environments, or where devices are often idle, customer experience can be greatly enhanced by allowing the memory controller to skip many clean-up and remediation or recovery flows that existing algorithms require, and quickly return to a state where the memory device can service host commands.

Figure 4:
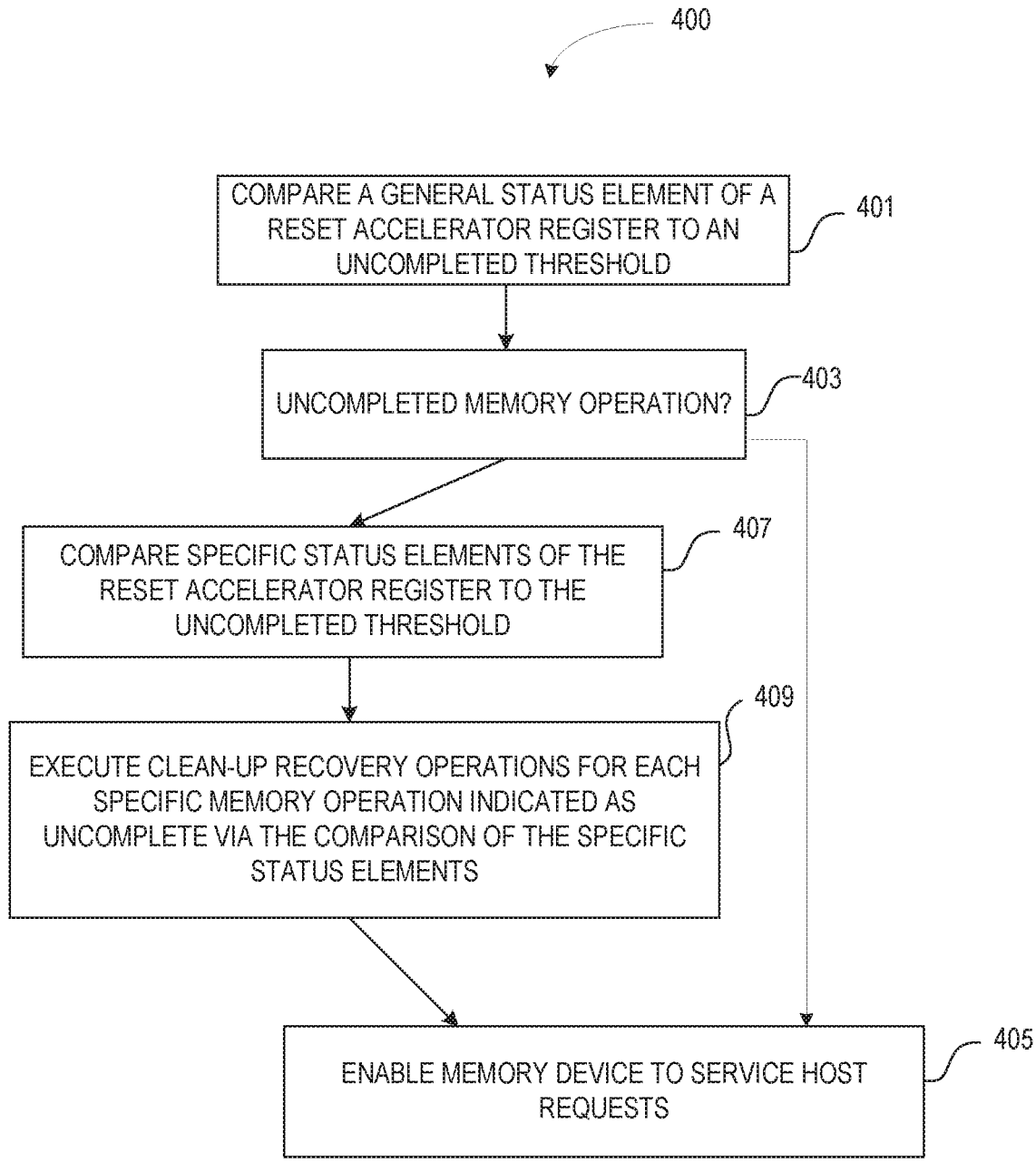
FIG. 4 illustrates generally a flowchart of an example method of using a reset accelerator register to recover from an unexpected reset of a memory device.

FIG. 4 illustrates generally a flowchart of an example method 400 of using a reset accelerator register to recover from an unexpected reset of a memory device. At 401, when an electronic device or a memory device is restart after experiencing an unexpected reset, such as during an unexpected power down or droop in supply voltage, the memory controller can compare an element of a reset accelerator register of the memory device to an uncompleted threshold. At 403, If the comparison satisfies the uncompleted threshold, the reset acceleration register indicates that at least one memory operation was in-process when the unexpected reset event occurred. If, at 403, the comparison does not satisfy the uncompleted threshold, at 405, the memory controller can be enabled, or can enable other processes, to service memory requests from a host. It is understood that the method can use a completed threshold for one or more of the comparisons without departing from the scope of the present subject matter.

At 407, if the general status (GS) element indicates uncompleted memory operations upon restarting the memory device, the memory controller can compare specific status elements of the reset accelerator register with either a completed threshold or an uncompleted threshold to determine what specific memory operations were in-process at or near the time of the unexpected reset event. At 409, the memory controller can schedule and initiate clean up and recovery of the memory that may have been affected by the unexpected reset event as indicated by the specific status elements of the reset accelerator register. After completion of the clean-up and recovery activities, at 405, the memory controller can be enabled, or can enable other processes, to service memory requests from a host.

In certain examples, the reset accelerator register can be a multiple bit register with a general status (GS) bit element and several specific status bit elements. In some examples, the reset accelerator register can be a multiple word register with the general status (GS) element being either a single word or a single bit and specific status elements being a bit, a word, or a combination of bits and words. For example, each specific status element can also have one or more words of the reset accelerator register mapped thereto. The mapped words can include additional details about the specific memory operation indicated by the specific status element. Such information can include, but is not limited to a physical address associated with the memory operation, a copy or representation of the host request initiating the memory operation, status information associated with sub-processes of the specific memory operation, etc. The amount and specificity of such information can be directly related to the amount of brute force direct analysis of the memory may be required to determine if recovery activities are beneficial or to determine what type and schedule of recovery activities are appropriate. Having such information readily available in the reset accelerator register can avoid wasting time applying complex brute force analysis of the memory to determine what memory were, or were not, in-process at or near the time the unexpected reset event occurred.

In some existing memory devices, status information is maintained while the memory device is operating, however, the status information is maintained in volatile memory or memory that is otherwise reset upon startup of the memory device after a reset event. In certain examples, a memory device according to the present subject matter does not reset the reset accelerator register upon start-up of the memory device.

Figure 5:
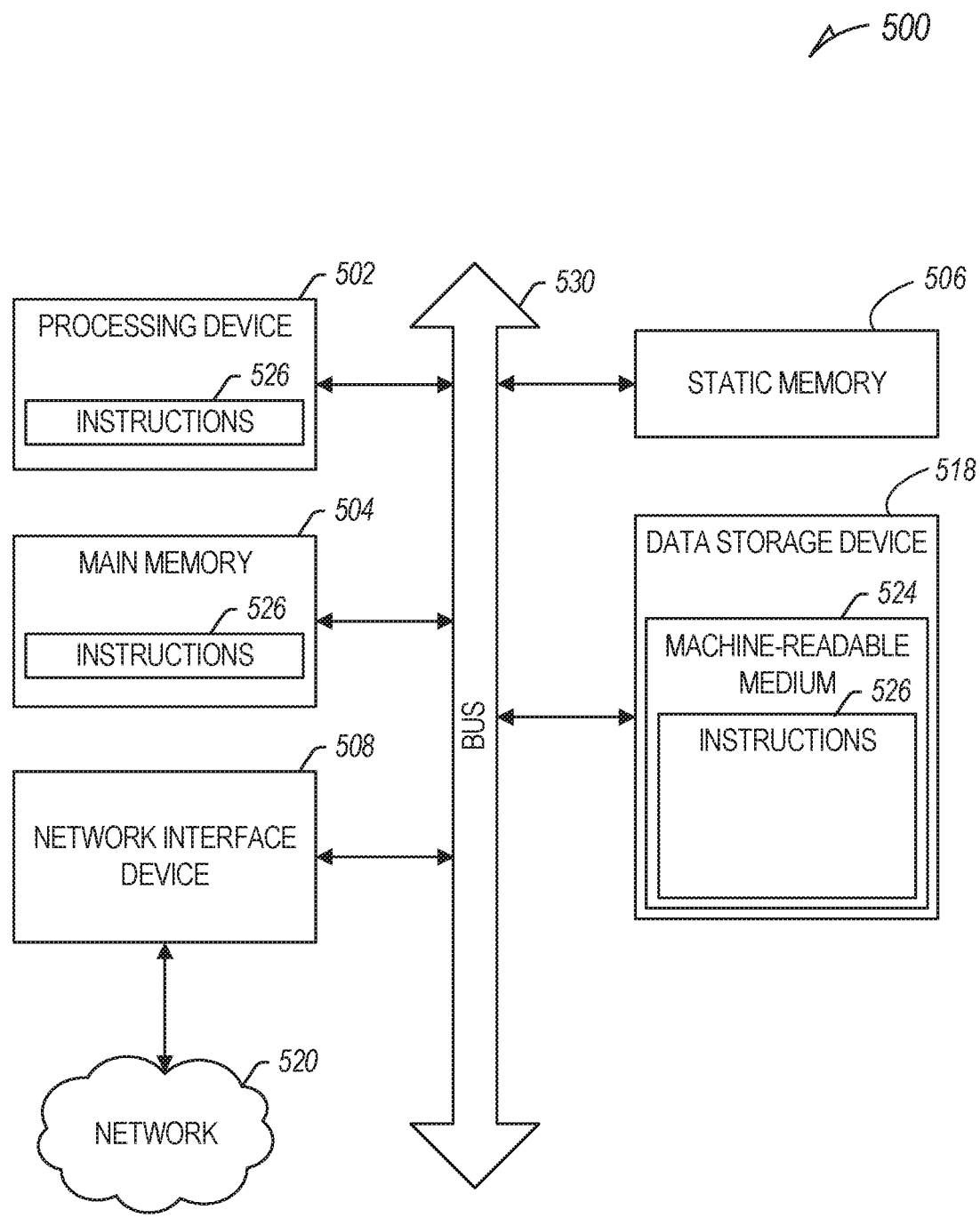
FIG. 5 illustrates a block diagram of an example machine upon which any one or more of the techniques (e.g., methodologies) discussed herein may perform.

FIG. 5 illustrates a block diagram of an example machine 500 upon which any one or more of the techniques (e.g., methodologies) discussed herein may perform. In alternative embodiments, the machine 500 may operate as a standalone device or may be connected (e.g., networked) to other machines. In a networked deployment, the machine 500 may operate in the capacity of a server machine, a client machine, or both in server-client network environments. In an example, the machine 500 may act as a peer machine in peer-to-peer (P2P) (or other distributed) network environment. The machine 500 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired).

In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 500 (e.g., the host 105, the memory device 110, etc.) may include a processing device 502 (e.g., a hardware processor, a central processing unit (CPU), a graphics processing unit (GPU), a hardware processor core, or any combination thereof, such as a memory controller of the memory device 110, etc.), a main memory 504 (e.g., read-only memory (ROM), flash memory, dynamic random-access memory (DRAM) such as synchronous DRAM (SDRAM) or Rambus DRAM (RDRAM), etc.), a static memory 506 (e.g., flash memory, static random-access memory (SRAM), etc.), and a data storage system 518, some or all of which may communicate with each other via an interlink (e.g., bus) 530.

The processing device 502 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 can be configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 or within the processing device 502 during execution thereof by the computer system 500, the main memory 504 and the processing device 502 also constituting machine-readable storage media. The machine-readable storage medium 524, the data storage system 518, or the main memory 504 can correspond to the memory device 110 of FIG. 1.

In one implementation, the instructions 526 include instructions to implement accelerated reset recovery functions using the reset accelerator register 160, 260, 360 of any one or more of FIG. 1, FIG. 2, or FIG. 3, or the method of FIG. 4. While the machine-readable storage medium 524 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 500 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 500 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 526 (e.g., software, programs, an operating system (OS), etc.) or other data are stored on the data storage device 518 can be accessed by the main memory 504 for use by the processing device 502. The main memory 504 (e.g., DRAM) is typically fast, but volatile, and thus a different type of storage than the data storage device 518 (e.g., an SSD), which is suitable for long-term storage, including while in an "off" condition. The instructions 526 or data in use by a user or the machine 500 are typically loaded in the main memory 504 for use by the processing device 502. When the main memory 504 is full, virtual space from the data storage device 518 can be allocated to supplement the main memory 504; however, because the data storage device 518 device is typically slower than the main memory 504, and write speeds are typically at least twice as slow as read speeds, use of virtual memory can greatly reduce user experience due to storage device latency (in contrast to the main memory 504, e.g., DRAM). Further, use of the data storage device 518 for virtual memory can greatly reduce the usable lifespan of the data storage device 518.

In contrast to virtual memory, virtual memory compression (e.g., the Linux™ kernel feature "ZRAM") uses part of the memory as compressed block storage to avoid paging to the data storage device 518. Paging takes place in the compressed block until it is necessary to write such data to the data storage device 518. Virtual memory compression increases the usable size of the main memory 504, while reducing wear on the data storage device 518.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 524 may further be transmitted or received over a network 520 using a transmission medium via the network interface device 508 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 508 may include one or more physical jacks (e.g., Ethernet, coaxial, or phone jacks) or one or more antennas to connect to the network 520. In an example, the network interface device 508 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 500, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Additional Notes and Examples

Example 1 is a method comprising: at a first start-up of a memory device, comparing a general status element of a reset accelerator register of the memory device to a first uncompleted threshold; determining on the first start-up of the memory device that the general status element indicates an uncompleted memory operation, and in response to such determining, comparing specific status elements of the reset accelerator register to a second uncompleted threshold to determine one or more specific uncompleted memory operations, the specific status elements each indicative of a status of a respective specific memory operation of a group of specific memory operations; executing clean-up recovery operations associated with each specific memory operation of the group of memory operations indicated as uncompleted via the specific status elements of the reset accelerator register; and determining on a second start-up of the memory device that the general status element does not indicate an uncompleted memory operation, and in response to such determining enabling the memory device to respond to host commands.

In Example 2, the subject matter of Example 1, including, at memory device start-up, not resetting the reset accelerator register.

In Example 3, the subject matter of any of Examples 1-2, wherein if a first specific status element of the specific status elements does not satisfy the uncompleted threshold in response to a comparison, checking a second specific status element of the reset accelerator register; and if the first specific status element satisfies the uncompleted threshold in response to the comparison, executing a first clean-up recovery operation to complete an operation of the memory device that was in-process before the last shutdown of the memory device prior to the start-up.

In Example 4, the subject matter of Example 3, wherein the first specific status element is indicative of a garbage collection operation.

In Example 5, the subject matter of any of Examples 3-4, wherein the first specific status element is indicative of a refresh operation.

In Example 6, the subject matter of any of Examples 3-5, wherein the first specific status element is indicative of a wear leveling operation.

In Example 7, the subject matter of any of Examples 3-6, wherein the first specific status element is indicative of a block retirement operation.

In Example 8, the subject matter of any of Examples 3-7, wherein the first specific status element is indicative of a host read or write operation.

In Example 9, the subject matter of any of Examples 3-8, wherein the first specific status element is indicative of a power-on recovery operation.

Example 10 is a memory device comprising: a group of non-volatile memory cells; a non-volatile, reset accelerator register; and a processing device operably coupled to the group of non-volatile memory cells, the processing device configured to perform operations comprising: initiate a first memory operation of a number of memory operations on the group of non-volatile memory cells; set a general indication of a reset accelerator register to indicate any one of the number of memory operations is initiated and not completed; set a first indication of the reset accelerator register to indicate the first memory operation is initiated and not completed; and reset the first indication in response to completion of the first memory operation.

In Example 11, the subject matter of Example 10, wherein, upon start-up of the memory device, the processing device is further configured to perform operations comprising: compare the general indication of the reset accelerator register to a first threshold; compare the first indication of the reset accelerator register to an uncompleted threshold when the general indication satisfies the first threshold; and finish the first memory operation when the first indication satisfies the uncompleted threshold.

In Example 12, the subject matter of Example 11, wherein the operation to finish the first memory operation includes retrieving a physical address of the memory device from a record of the reset accelerator register mapped to the first indication, the physical address associated with an area of non-volatile memory cells of the group of non-volatile memory cells associated with the first memory operation.

In Example 13, the subject matter of any of Examples 11-12, wherein the first indication is indicative of garbage collection of a block of data.

In Example 14, the subject matter of any of Examples 11-13, wherein the first indication is indicative of a refresh of a data block.

In Example 15, the subject matter of any of Examples 11-14, wherein the first indication is indicative of a wear leveling operation.

In Example 16, the subject matter of any of Examples 11-15, wherein the first indication is indicative of read error handling.

In Example 17, the subject matter of any of Examples 11-16, wherein the first indication is indicative of write error handling.

In Example 18, the subject matter of any of Examples 11-17, wherein the first indication is indicative of block retirement.

In Example 19, the subject matter of any of Examples 11-18, wherein the first indication is indicative of handling a host write operation.

In Example 20, the subject matter of any of Examples 11-19, wherein the first indication is indicative of handling a host read activity.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
    at a first start-up of a memory device, comparing a general status element of a reset accelerator register of the memory device to a first uncompleted threshold;
    determining on the first start-up of the memory device that the general status element indicates an uncompleted memory operation, and in response to such determining, comparing specific status elements of the reset accelerator register to a second uncompleted threshold to determine one or more specific uncompleted memory operations, the specific status elements each indicative of a status of a respective specific memory operation of a group of specific memory operations;
    executing clean-up recovery operations associated with each specific memory operation of the group of memory operations indicated as uncompleted via the specific status elements of the reset accelerator register; and
    determining on a second start-up of the memory device that the general status element does not indicate an uncompleted memory operation, and in response to such determining enabling the memory device to respond to host commands.

2. The method of claim 1, including, at memory device start-up, not resetting the reset accelerator register.

3. The method of claim 1, wherein
    if a first specific status element of the specific status elements does not satisfy the uncompleted threshold in response to a comparison, checking a second specific status element of the reset accelerator register; and
    if the first specific status element satisfies the uncompleted threshold in response to the comparison, executing a first clean-up recovery operation to complete an operation of the memory device that was in-process before the last shutdown of the memory device prior to the start-up.

4. The method of claim 3, wherein the first specific status element s indicative of a garbage collection operation.

5. The method of claim 3, wherein the first specific status element is indicative of a refresh operation.

6. The method of claim 3, wherein the first specific status element is indicative of a wear leveling operation.

7. The method of claim 3, wherein the first specific status element s indicative of a block retirement operation.

8. The method of claim 3, wherein the first specific status element is indicative of a host read or write operation.

9. The method of claim 3, wherein the first specific status element is indicative of a power-on recovery operation.

10. A memory device comprising:
    a group of non-volatile memory cells;
    a non-volatile, reset accelerator register;
    a processing device operably coupled to the group of non-volatile memory cells, the processing device configured to perform operations comprising:
        initiate a first memory operation of a number of memory operations on the group of non-volatile memory cells;
        set a general indication of a reset accelerator register to indicate any one of the number of memory operations is initiated and not completed;
        set a first indication of the reset accelerator register to indicate the first memory operation is initiated and not completed; and
        reset the first indication in response to completion of the first memory operation; and
    wherein, upon start-up of the memory device, the processing device is further configured to perform operations comprising:
        compare the general indication of the reset accelerator register to a first threshold;
        compare the first indication of the reset accelerator register to an uncompleted threshold when the general indication satisfies the first threshold; and
        finish the first memory operation when the first indication satisfies the uncompleted threshold.

11. The memory device of claim 10, wherein the operation to finish the first memory operation includes retrieving a physical address of the memory device from a record of the reset accelerator register mapped to the first indication, the physical address associated with an area of non-volatile memory cells of the group of non-volatile memory cells associated with the first memory operation.

12. The memory device of claim 10, wherein the first indication is indicative of garbage collection of a block of data.

13. The memory device of claim 10, wherein the first indication is indicative of a refresh of a data block.

14. The memory device of claim 10, wherein the first indication is indicative of a wear leveling operation.

15. The memory device of claim 10, wherein the first indication is indicative of read error handling.

16. The memory device of claim 10, wherein the first indication is indicative of write error handling.

17. The memory device of claim 10, wherein the first indication is indicative of block retirement.

18. The memory device of claim 10, wherein the first indication is indicative of handling a host write operation.

19. The memory device of claim 10, wherein the first indication is indicative of handling a host read activity.

* * * * *